United States Patent
Loh et al.

(10) Patent No.: US 9,758,381 B2
(45) Date of Patent: Sep. 12, 2017

(54) METHOD TO TRANSFER TWO DIMENSIONAL FILM GROWN ON METAL-COATED WAFER TO THE WAFER ITSELF IN A FACE-TO FACE MANNER

(71) Applicant: National University of Singapore, Singapore (SG)

(72) Inventors: Kian Ping Loh, Singapore (SG); Libo Gao, Singapore (SG); Antonio Helio Castro Neto, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 14/910,095

(22) PCT Filed: Jul. 31, 2014

(86) PCT No.: PCT/SG2014/000366
§ 371 (c)(1),
(2) Date: Feb. 4, 2016

(87) PCT Pub. No.: WO2015/020610
PCT Pub. Date: Feb. 12, 2015

(65) Prior Publication Data
US 2016/0176713 A1      Jun. 23, 2016

Related U.S. Application Data

(60) Provisional application No. 61/862,127, filed on Aug. 5, 2013.

(51) Int. Cl.
*H01L 21/02*   (2006.01)
*H01L 29/16*   (2006.01)
(Continued)

(52) U.S. Cl.
CPC ...... *C01B 31/0453* (2013.01); *C01B 31/0484* (2013.01); *C23C 16/01* (2013.01);
(Continued)

(58) Field of Classification Search
CPC ........... H01L 21/02527; H01L 29/1606; H01L 29/66015
See application file for complete search history.

(56) References Cited

U.S. PATENT DOCUMENTS 9,193,133 B2 *  11/2015  Shin ................ H01L 29/1606
9,418,770 B2 *   8/2016  Veerasamy ............. C30B 29/02
(Continued)

FOREIGN PATENT DOCUMENTS

WO      WO 2013/043120 A1     3/2013

OTHER PUBLICATIONS

Kim, Y-J., et al., "Low-temperature growth and direct transfer of graphene-graphitic carbon films on flexible plastic substrates", Nanotechnology, (2012), vol. 23, p. 344016-344022.
(Continued)

*Primary Examiner* — Cuong Q Nguyen
(74) *Attorney, Agent, or Firm* — Hamilton, Brook, Smith & Reynolds, P.C.

(57) ABSTRACT

A method of in-situ transfer during fabrication of a component comprising a 2-dimensional crystalline thin film on a substrate is disclosed. In one embodiment, the method includes forming a layered structure comprising a polymer, a 2-dimensional crystalline thin film, a metal catalyst, and a substrate. The metal catalyst, being a growth medium for the two-dimensional crystalline thin film, is etched and removed by infiltrating liquid to enable the in-situ transfer of the two-dimensional crystalline thin film directly onto the underlying substrate.

14 Claims, 3 Drawing Sheets

(51) Int. Cl.
*C01B 31/04* (2006.01)
*C23C 16/01* (2006.01)
*C23C 16/02* (2006.01)
*C23C 16/26* (2006.01)
*H01L 29/786* (2006.01)

(52) U.S. Cl.
CPC ...... *C23C 16/0263* (2013.01); *C23C 16/0281* (2013.01); *C23C 16/26* (2013.01); *H01L 21/02002* (2013.01); *H01L 21/0262* (2013.01); *H01L 21/02381* (2013.01); *H01L 21/02488* (2013.01); *H01L 21/02491* (2013.01); *H01L 21/02502* (2013.01); *H01L 21/02527* (2013.01); *H01L 21/02658* (2013.01); *H01L 21/02664* (2013.01); *H01L 21/02694* (2013.01); *H01L 29/1606* (2013.01); *H01L 29/78684* (2013.01); *H01L 21/02568* (2013.01)

(56) References Cited

U.S. PATENT DOCUMENTS

| 9,595,436 | B2* | 3/2017 | Beasley .............. H01L 21/0237 |
|---|---|---|---|
| 2010/0021708 | A1 | 1/2010 | Kong et al. |
| 2011/0030991 | A1* | 2/2011 | Veerasamy ............. C30B 29/02 174/126.1 |
| 2011/0163289 | A1 | 7/2011 | Zhu |
| 2013/0001515 | A1 | 1/2013 | Li et al. |
| 2013/0099195 | A1 | 4/2013 | Seacrist et al. |
| 2013/0187097 | A1 | 7/2013 | Hong et al. |

OTHER PUBLICATIONS

Notification of Transmittal of the International Search Report and the Written Opinion of the International Searching Authority, or the Declaration for International Application No. PCT/SG2014/000366, "Method to Transfer Two Dimensional Film Grown on Metal-Coated Wafer to the Wafer Itself in a Fact-To-Face Manner"; Date of Mailing: Oct. 23, 2014.

Notification Concerning Transmittal of International Preliminary Report on Patentability for International Application No. PCT/SG2014/000366, "Method to Transfer Two Dimensional Film Grown on Metal-Coated Wafer to the Wafer Itself in a Fact-To-Face Manner"; Date of Mailing: Feb. 9, 2016.

Supplementary European Search Report for EP Application No. 14 83 5353, "Method to Transfer Two Dimensional Film Grown on Metal-Coated Wafer to the Wafer Itself in a Face-to-Face Manner", dated Mar. 10, 2017.

* cited by examiner

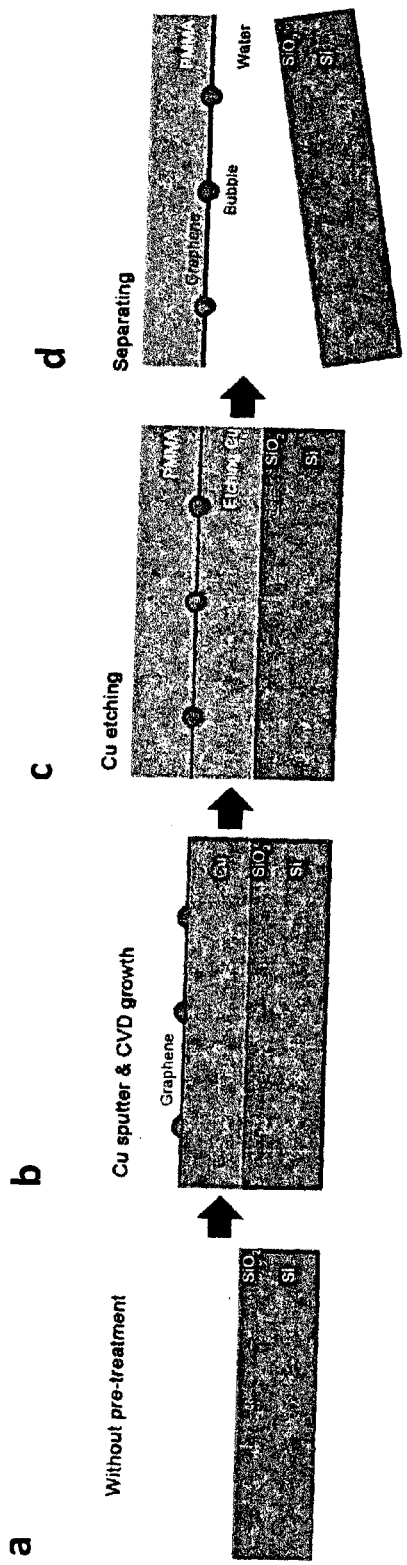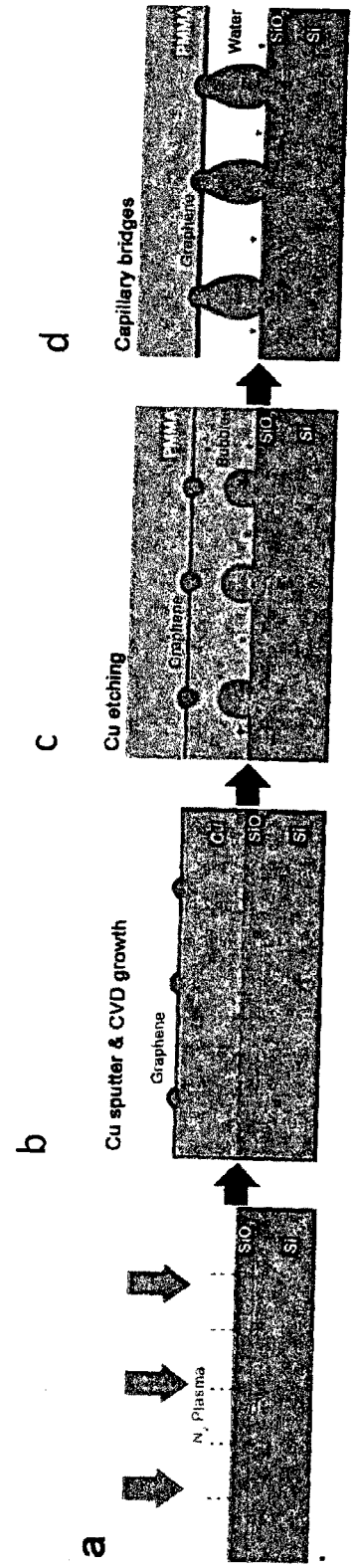
FIG. 1a - 1d
FIG. 2a - 2d

METHOD TO TRANSFER TWO DIMENSIONAL FILM GROWN ON METAL-COATED WAFER TO THE WAFER ITSELF IN A FACE-TO FACE MANNER

RELATED APPLICATIONS

This application is the U.S. National Stage of International Application No. PCT/SG2014/000366, filed Jul. 31, 2014, which designates the U.S., published in English, and claims the benefit of U.S. Provisional Application No. 61/862,127, filed Aug. 5, 2013. The entire teachings of the above applications are incorporated herein by reference.

BACKGROUND ART

Recently, there has been a resurgence of interest in the growth of ultrathin films of two dimensional (2-D) crystalline materials. These ultrathin films of two dimensional (2-D) crystalline materials, referred to herein as 2-D films, can be grown on a metal catalyst that has been pre-coated on a substrate by decomposing the growth precursors using either thermal or plasma activation. Subsequent to the growth of the 2-D film, there is typically a need to delaminate and transfer the grown 2-D film onto another substrate. Despite the advances in growth technology, the transfer process remains a bottleneck causing defects in the form of cracks, folds, tears, wrinkles, etc. in the 2-D thin film during transfer. While a roll-to-roll transfer method has been developed for flexible substrates, it is not suitable for stiff substrates such as silicon and glass. Hence, there is a need for better wafer scale transfer methods for 2-D films.

SUMMARY OF THE INVENTION

The following presents a simplified summary of the invention in order to provide a basic understanding of some aspects of the invention. This summary is not an extensive overview of the invention. It is not intended to either identify key or critical elements of the invention or delineate the scope of the invention. Rather, its primary purpose is merely to present one or more concepts of the invention in a simplified form as a prelude to the more detailed description that follows in later sections of the present application.

A method of transferring a thin film of a 2-D crystalline material from a catalyst to an underlying substrate in a face-to-face manner without delaminating the 2-D thin film. The ultrathin film is grown on a catalyst that is coated on an underlying substrate, which collectively forms a 3 layer structure where the catalyst forms the interlayer between the 2-D thin film and the underlying substrate. The method involves in-situ removal of the catalyst interlayer between the 2-D film and the underlying substrate and transfer and direct bonding of the 2-D thin film onto the underlying substrate without detachment of the 2-D film from the catalyst. The advantages of the present invention include wafer scale, crease-free transfer of thin films directly onto any wafer or substrate. This transfer method can be used to transfer 2-D films onto many kinds of substrates, such as but not limited to Si/SiO2 wafer, quartz, BN, $MoS_2$, $WSe_2$, $WS_2$, mica, glass, polymers, plastics, metals.

A first aspect of the invention provides a method of fabricating a component (e.g., 2-D film), comprising creating a subsurface gas source in a substrate; depositing a catalyst layer on the substrate; growing a crystalline thin film on the catalyst layer; coating a polymer layer on the crystalline thin film; etching the catalyst layer by liquid infiltration and simultaneously contacting the crystalline thin film with the substrate; cleaning the crystalline thin film and substrate to remove residual etchant used to etch the catalyst layer; removing moisture from the 2-dimensional crystalline film and the substrate; and removing the polymer layer to provide the component. In one embodiment, the crystalline thin film is a 2-D film formed from carbon, boron nitride, or 2-dimensional chalcogenides, or a combination thereof.

In one embodiment, creating of a subsurface gas source comprises pre-treatment of the substrate surface with a plasma of gases or ions. In another embodiment, the subsurface gas source forms a metastable phase in the substrate.

In a second aspect of the invention, etching of the catalyst layer further comprises activating release of gas bubbles from the subsurface gas source. In one embodiment, releasing of gas bubbles from the subsurface gas source forms capillary bridges at the interface of the crystalline thin film and the substrate.

The residual etchant can be cleaned or removed from the crystalline thin film and substrate. In one embodiment, cleaning the crystalline thin film and substrate comprises use of a first solvent to infiltrate the interface between the crystalline thin film and the substrate.

In another embodiment, the removing of moisture comprises baking the 2-dimensional crystalline film and the substrate. In yet another embodiment, removing of the polymer comprises using a second solvent.

A third aspect of the invention provides a method for transferring a thin film to a substrate, comprising etching a metal catalyst disposed between the thin film and the substrate, wherein the etching simultaneously promotes in-situ face-to-face contact between the crystalline thin film and the substrate without the need to delaminate and transfer the film from the substrate.

In one embodiment, the in-situ face-to-face contact between the crystalline thin film and the substrate further comprises release of gas bubbles from a subsurface gas source implanted in the substrate. In another embodiment, the release of the gas bubbles forms capillary bridges. In yet another embodiment, the capillary bridges progressively replace the etched metal layer at the interface between the crystalline thin film and the substrate in the presence of a fluid infiltrated at the interface.

Different fluids can be used to infiltrate between the crystalline thin film and the substrate. In one embodiment, the fluid is selected from the group consisting of an etchant, a solvent and a surface active agent, or a combination thereof. A surface active agent can also be used in the methods of the invention to remove creases and ripples in the crystalline thin film.

A fourth aspect of the invention provides a method where the removal of a metal catalyst growth medium disposed between a crystalline thin film and a substrate releases gas bubbles from a subsurface gas source implanted in the substrate during a pre-treatment.

A fifth aspect of the invention provides a method for promoting the propagation of the gas bubbles to form capillary bridges that progressively replace a metal layer at the interface between a crystalline thin film and a substrate in the presence of a fluid infiltrated in the interface during an etching process.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 1a-d depict a schematic illustration of a known float transfer process of graphene thin films, which does not operate with capillary bridges formed in-situ.

FIG. 2a shows the pre-treatment by $N_2$ plasma of the substrate.

FIG. 2b shows the CVD growth of the graphene after the metal catalyst is sputtered over the substrate surface.

FIG. 2c shows the etching of the Cu film and in-situ fusion of gas bubbles.

FIG. 2d shows that capillary bridges help to tether the graphene film onto the substrate as the metal catalyst between them is etched and removed.

FIG. 4a is a photograph of an eight inch graphene sample, grown on Cu film that has been sputtered onto a $Si/SiO_2$ wafer and spin-coated with PMMA corresponding to FIG. 3a.

FIG. 4b is a photograph of a commonly known transfer method with floating graphene/PMMA on the etchant.

FIG. 4c is an optical image of graphene film cracks obtained using the common known floating transfer method.

FIG. 4d is a photograph of a component having a structure $Si/SiO_2/Cu/Graphene/PMMA$ immersed in the etchant using the in-situ face to face transfer method of the present invention and corresponds to the step depicted in FIG. 3b.

FIG. 4e is a photograph of a component having a structure $Si/SiO_2/Water/graphene/PMMA$ in water, which corresponds to the step depicted FIG. 3c.

FIG. 4f is a photograph of a component having a structure $Si/SiO_2/graphene/PMMA$ during baking, which is corresponds to the step depicted FIG. 3d.

FIG. 4g is a Raman spectra comparison of the two different transfer processes, showing that the in-situ "face-to-face" transfer method of the present invention can provide high quality graphene films.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figures 3A, 3B, 3C, 3D:
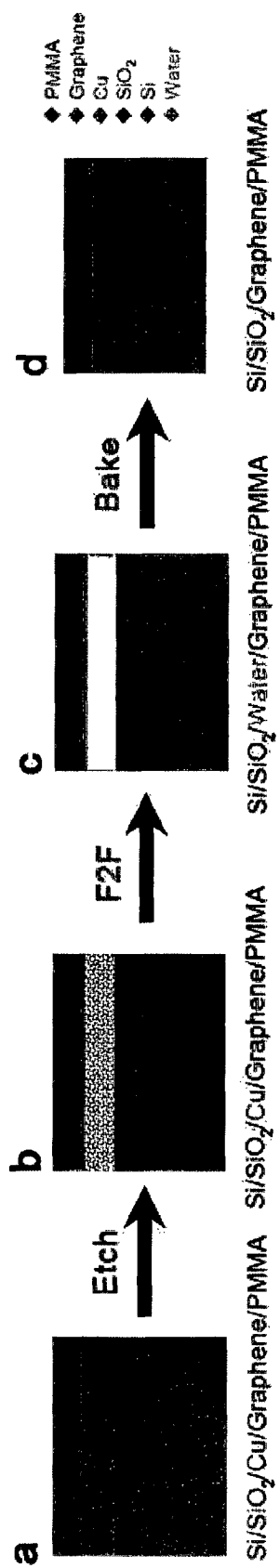
FIG. 3a is a cross-sectional view of the structure of a component formed by the current method comprising a graphene sample grown on metal (Cu) catalyst film that has been sputtered on a $Si/SiO_2$ substrate (wafer).
FIG. 3b is a cross-sectional view of the component of FIG. 3a when the component has been treated with a suitable etchant.
FIG. 3c is a cross-sectional view of the component of FIG. 3b after the component has been washed with deionized (DI) water. Washing of the component of FIG. 3b provides a component comprising graphene/PMMA connected to the $Si/SiO_2$ substrate (wafer) through a water layer.
FIG. 3d is a cross-sectional view of component of FIG. 3c once the component is baked and the DI water is removed, leaving graphene/PMMA disposed directly on the $Si/SiO_2$ substrate (wafer).

The drawings, FIGS. 1-3 show embodiments of a method for forming a component incorporating an ultrathin (2-D) film. The ultrathin film of 2-dimensional crystalline structure can be formed from various materials including, but not limited to, carbon, (hexagonal) boron nitride, 2-dimensional chalcogenides (e.g., $MoS_2$, $MoSe_2$, $WS_2$, $WSe_2$, $NbSe_2$, $TiSe_2$), black phosphorus or a combination thereof.

In one embodiment, the 2-D crystalline material is graphene. Graphene, a 2-D crystalline material comprising $sp^2$-bonded carbon atoms arranged in a hexagonal pattern, has a large number of potential applications including: single molecule sensors, high frequency transistors, optical modulators, electrochromic devices, conducting and transparent electrodes, thermal sinks, photovoltaics and solar cells, super-capacitors and batteries, scaffold for cell growth, anti-bacterial material, and impermeabilization of surfaces, among others. The large number of applications is due to the outstanding properties of graphene. Graphene is the thinnest imaginable material, possessing a largest surface-to-weight ratio (~2,700 $m^2/g$). It is one of the strongest material 'ever measured' having a Young modulus of 1 TPa and one of the softest having a bending stiffness of 1 eV. Graphene is also one of the most stretchable crystals (deformed up to 20% elastically) and holds the record for thermal conductivity ($5 \times 10^3$ W/mK) outperforming diamonds. It carries the highest current density at room temperature (106 times than Cu), has the highest intrinsic mobility (100 times larger than Si), and is completely impermeable (even He atoms cannot penetrate its structure).

"Graphene," as the term is used herein, is defined as single or multiple layers of graphene sheets. The graphene as considered in the present invention describes the material, and is not restricted by the methods used to prepare the material. Such methods include, but are not limited to, mechanical exfoliation, epitaxial growth, thermal chemical vapor deposition thermal (CVD), or plasma-assisted Chemical Vapor Deposition (ICP-CVD), and chemical processed (solution processed) methods, as well as laser ablation and filtered cathodic arc methods. Chemical vapor deposition generally covers any vapor phase deposition process of thin film where hydrocarbons are decomposed to form thin films, such as by a thermal process. ICP-CVD refers to a deposition process where there is a plasma discharge is used to aid with the dissociation of hydrocarbons at much lower temperatures than thermal CVD.

Graphene of the invention includes, but is not limited to, chemical vapor deposited graphene, epitaxial grown graphene, mechanical exfoliated graphene, and chemically modified graphene, or a combination thereof. As used herein, "functionalized or derivatized graphene" refers to the chemical attachment of chemical functional groups or dye molecules on the graphene or graphene oxide for the purpose of modifying its solubility, dispersability, electronic and optical properties. The graphene can be single or multiple layers graphene.

"Boron nitride," as the term is used herein, is defined as single or multiple layers of boron nitride sheets. The boron nitride as considered in the present invention describes the material, and is not restricted by the methods used to prepare the material. Such methods include, but are not limited to, ion beam deposition, plasma-enhanced chemical vapor deposition, pulsed later deposition, reactive sputtering and physical vapor deposition, mechanical exfoliation.

"2-dimensional chalcogenides" as the term is used herein, is defined as single or multiple layers of a chalcogenide or dichalcogenide such as $MoS_2$, $MoSe_2$, $WS_2$, $WSe_2$, $NbSe_2$, $TiSe_2$. The 2-dimensional chalcogenides as considered in the present invention describe the material, and is not restricted by the methods used to prepare the material. Such methods include, but are not limited to, hydrothermal synthesis, gas phase reaction, reduction, Chemical Vapor Deposition, and liquid phase exfoliation.

The term "multi-layer" as in "multi-layer graphene" or "multi-layer hexagonal boron nitride" refers to a material that has multiple layers of single atomic layer of the material (e.g., graphene or hexagonal boron nitride). In one embodiment, graphene is multi-layer graphene. In another embodiment, the hexagonal boron nitride is multi-layer hexagonal boron nitride. The graphene or hexagonal boron nitride can have between about 1 to about 20 layers.

Using graphene as an example of a 2-D crystalline material, the following paragraphs describe the methods of the present invention, which differ from the conventional "floating transfer" technique in which the 2-D film has to be delaminated and floated on water before it can be recovered.

In the in-situ face-to-face transfer of a 2-D film (e.g., graphene) from a metal-coated surface to the underlying substrate during fabrication of a component, the 2-D film, disposed on metal-coated substrate, progressively contacts the substrate as the metal catalyst between the substrate and the film is etched. This in-situ transfer is without delaminating or detaching the 2-D film from the metal or substrate surface. Instead, the film adheres directly to the substrate without the metal catalyst.

FIGS. 2a-d are a schematic illustrations of the in-situ face-to-face transfer method of a 2-D crystalline thin film from a catalyst surface to an underlying substrate surface with in-situ capillary bridges (aka air bridge) holding the 2-D crystalline thin film in place in the presence of an etchant as the metal catalyst is etched. The etching process relies on infiltration of the liquid etchant into the interface between graphene, metal and substrate, FIG. 2a shows the pretreatment of the growth on underlying substrate. The substrate, for example $SiO_2$ on silicon ($SiO_2$/Si), is injected with ions of plasma excited gases in a vacuum chamber. These may include, but not limited to, for example, argon (Ar) plasma, helium (He) plasma, neon (Ne) plasma, krypton (Kr) plasma, xenon (Xe) plasma, Radon (Rn) plasma, nitrogen ($N_2$) plasma, oxygen ($O_2$) plasma, and hydrogen ($H_2$) plasma, or a combination thereof. The pretreatment creates a subsurface/subterrestial gas source in the substrate or modifies the wetting properties of the substrate to promote cavitation. In the example where $N_2$ plasma is used in the pre-treatment of the substrate, a metastable silicon oxynitride phase in the substrate is formed carrying a subsurface gas source.

FIG. 2b shows the substrate coated with a thin layer of catalyst film. Catalysts that may be used to grow graphene include, but are not limited to, silicon oxide ($SiO_2$), nickel (Ni), copper (Cu), scandium (Sc), titanium (Ti), vanadium (V), manganese (Mn), iron (Fe), cobalt (Co), ruthenium (Ru), platinum (Pt), Gold (Au), Silver (Ag), (Iridium) Ir, (palladium) Pd, (rhodium) Rh, (molybdenum) Mo, (niobium) Nb, W, (tungsten) Cd, (germanium) Ge, (silicon) Si or a combination thereof, and may include also alloys, non-metal or non-oxide substrates. The metal catalyst can be deposited by sputtering, e-beam evaporation, or thermal evaporation under suitable coating conditions. The coating can be less than about 5 μm, preferably less than about 3 μm, more preferably less about 1 μm. Following the deposition of the metal film on the substrate, a graphene film is grown via a gaseous hydrocarbon source, for example, methane ($CH_4$), ethylene ($C_2H_4$), ethane (C2H6), acetylene (C2H2), benzene (C6H6), toluene (C7H8), naphthalene (C10H8), sublimed carbon or polymer, using thermal CVD, or inductively coupled plasma-assisted Chemical Vapor Deposition (ICP-CVD) at a growth temperature between about 150° C. to about 1100° C., at a temperature of between about 150° C. to about 800° C., preferably less than 800° C.

After the growth of the graphene thin film, a layer of polymer, poly(methyl methacrylate) (PMMA) is spin coated on the surface of graphene. Alternatively, the graphene thin layer can be coated with polyvinyl alcohol (PVA), polyvinylpyrrolidone (PVP), polydimethylsiloxane (PMDS) or other photo resists. Collectively, the PMMA is disposed over the substrate/metal/graphene structure as shown in FIG. 2c. Alternative embodiments of the substrate/metal include, but are not limited to, Si/$SiO_2$/Cu, Si/Cu, mica/Cu, quartz/Cu, glass/Cu, polymers/Cu, Si/$SiO_2$/Ni, Si/Ni, mica/Ni, quartz/Ni, glass/Ni, polymers/Co, Si/$SiO_2$/Co, Si/Co, mica/Co, quartz/Co, glass/Co, polymers/Co, or any substrate of thermal stability at a temperature of between about 150° C. and about 800° C.

For the purpose of describing the face-to-face transfer, the Si/$SiO_2$/Cu structure is used to illustrate the method. The cross sectional view of this starting structure comprising the metal catalyst, the graphene thin film layer and the polymer (PMMA) is shown view in FIG. 3a, which is abbreviated as Si/$SiO_2$/Cu/Graphene/PMMA structure. The Si/$SiO_2$/Cu/Graphene/PMMA structure was put into a Cu etchant solution, such as iron chloride, iron nitrate, or ammonium persulfate. This structure, as shown in FIG. 3b, is immersed fully in the solution between about 1 hour to about 4 hours. After the copper is etched away completely, the Si/$SiO_2$/Cu/Graphene/PMMA will be changed into Si/$SiO_2$/Water/Graphene/PMMA, as shown in FIG. 3c. For better etching of Cu film, a second etchant can be added. The Si/$SiO_2$/Water/Graphene/PMMA can be moved into this second etchant for removal of residual Cu film. In one embodiment, one etchant is used to remove the metal catalyst. In another embodiment two etchants are used to remove the metal catalyst. The first and second etchants can be the same or different. Immersion of the substrate/metal catalyst/2-D film/polymer can be between about 30 minutes to about 12 hours, preferably between about 1 hour to about 6 hours, most preferably between about 1 hour to about 2 hours.

The metal catalyst is removed via etching to provide the substrate/graphene/PMMA structure. Etching as defined herein is a process of using acids, bases or other chemicals to dissolve a metal template. Examples of etchants include, but are not limited to, iron chloride, iron nitrate, or ammonium persulfate, and hydrochloric acid or a combination thereof. Dilute solutions of these are preferred. For example, a copper or nickel catalyst can be removed after chemical vapor deposition of graphene using an etchant such as, but not limited to, hydrochloric acid (HCl), HCl/iron chloride ($FeCl_3$), dilute sulphuric acid ($H2SO_4$), dilute nitric acid ($HNO_3$), iron (III) nitrate ($Fe(NO3)_3$) solution, to provide the substrate/graphene/PMMA structure.

The structure is then placed into deionized (DI) water, a first solvent, for over 1 hour to remove residual etchant ions. Thereon, the structure is baked on a hot plate or in an oven to remove any remaining solvent (e.g., water), used to clean and remove residual etchant. The baking temperature can be set between about 50° C. to about 250° C., preferably between about 100° C. to about 200° C., more preferable between about 120° C. to about 170° C. FIG. 3d shows the structure Si/$SiO_2$/Graphene/PMMA, once all of the moisture has been removed and where the graphene thin film, coated with the PMMA, is disposed directly over the Si/$SiO_2$ substrate.

Finally, the polymer coating (PMMA) on the graphene thin film is removed by using a second solvent, such as acetone, leaving a structure comprising Si/$SiO_2$/Graphene. Through the method illustrated in the example above, a graphene thin film is transferred from a metal catalyst surface to the underlying substrate surface, in a "face-to-face" manner successfully.

The first and second solvents used in the methods of the present invention to clean and remove residual etchant and to remove the polymer coating from the 2-D film can be polar or non-polar. As used herein, "non-polar solvents" refers to solvents with a dielectric constant of less than 15 and can include, but are not limited to, aliphatic solvents, aromatic solvents, and other aprotic solvents. Examples of non-polar solvents include, but are not limited to, pentane, hexanes, heptane, hexadecane, cyclohexane, benzene, toluene, xylene, tetrahydrofuran, diethyl ether, ethyl acetate, and methylene chloride. In one embodiment, the non-polar solvent is an aliphatic solvent. In another embodiment, the non-polar solvent is an aromatic solvent. In yet another embodiment, the non-polar solvent is an aprotic solvent.

"Polar solvents," as used herein, refer to solvents with a dielectric constant of more than 15 and include, but are not limited to, aprotic and protic solvents. Examples of polar solvents include, but are not limited to, acetone, dimethylformamide, acetonitrile, propylene carbonate, acetic acid, formic acid, methanol, ethanol, n-propanol, isopropanol, n-butanol, nitromethane, and water (e.g., deionized water). In one embodiment, the polar solvent is an aprotic solvent. In another embodiment, the polar solvent is a protic solvent. In yet another embodiment the solvent is first deionized water. In another embodiment, the second solvent is acetone. "Protic Solvents," as used herein, refer to solvents capable of yielding or accepting a proton.

It is observed from the example above that the infiltration of fluid or liquid between the graphene and the substrate during the etching of the metal catalyst spontaneously forms capillary bridges that allow adhesion of the graphene film onto the substrate. Capillary bridges help to tether the graphene film onto the substrate as the metal catalyst between them is etched and removed. (FIG. 2d).

The pre-treatment step involving plasma excitation of gases and injection of its ions into the substrate, as shown in the above $N_2$ plasma example, produces metastable silicon oxynitride phases in the substrate $Si/SiO_2$. The metastable phases decompose readily during the CVD process at elevated temperatures and act as a source of subsurface/subterrestrial gas source trapped at the interface and in the Cu film. The deterministic bubble formation from the subsurface gas source acts as seeds for the capillary bridges. In the above example, the implanted nitrogen $N_2$ gas escapes through the Cu grains at the interface between Cu catalyst film and the $SiO_2$ substrate surface of during the etching and removal of the catalyst. The release of $N_2$ bubbles form capillary bridges that retain a hold of the graphene thin film and connect it to the substrate surface (FIGS. 2a-2d) in the presence of the fluid or liquid (e.g., etchant, solvent, surface agent) which has infiltrated in between the graphene and substrate.

After the plasma treatment process, the substrate, for example a silicon wafer, is coated with a metal catalyst (e.g., copper) of a certain thickness. The thickness of the coated metal should be controlled so that it is not larger than the critical thickness needed for the formation of capillary bridges and can be between about 300 nm to about 1 μm. Furthermore, the thickness of coated metal can be between about 3 to 4 times thicker than the thickness of spin-coated PMMA layer.

Figures 4A, 4B, 4C, 4D, 4E, 4F, 4G:
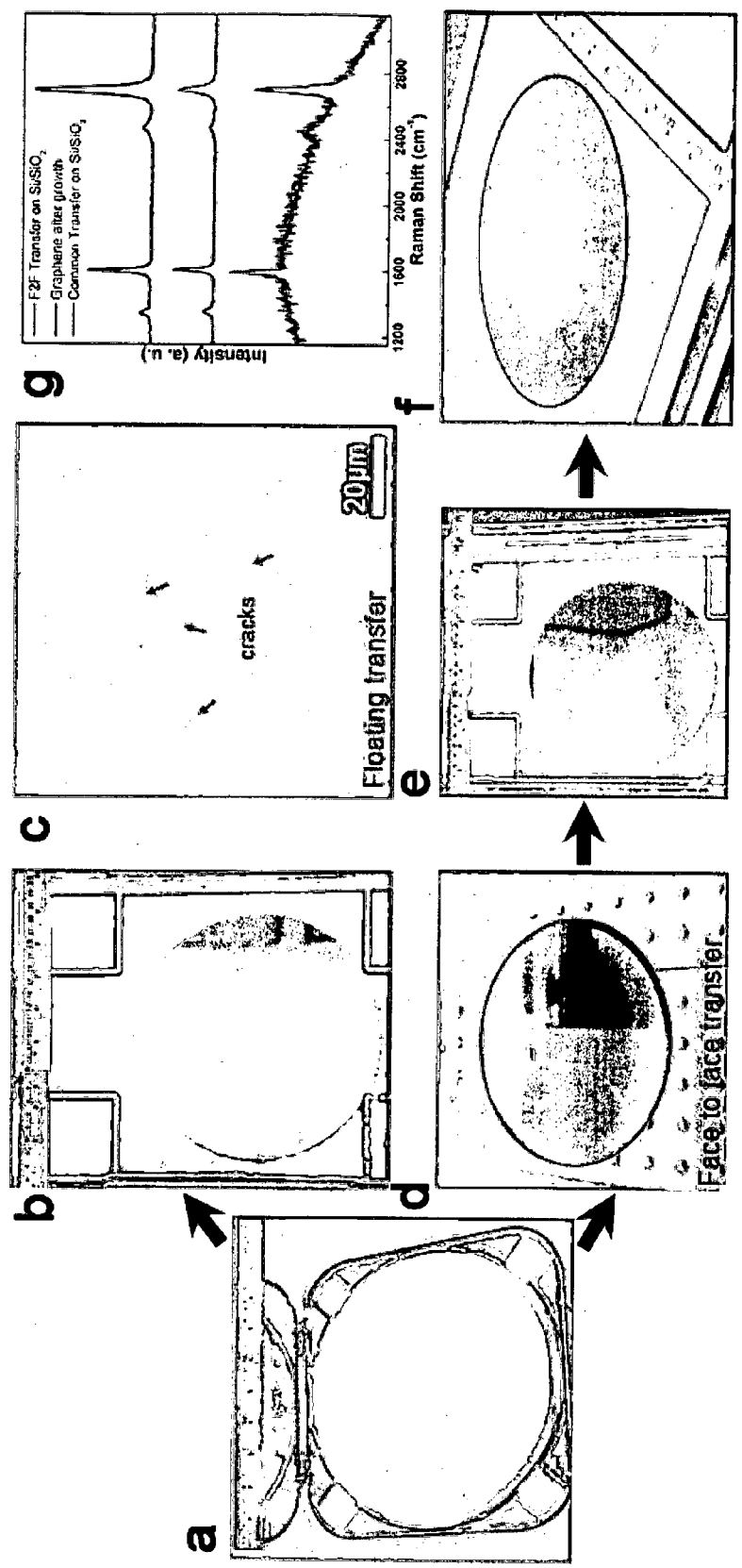

The substrate/metal/graphene/PMMA should be submerged fully in the etchant as shown in FIG. 4d. This is in contrast to the "floating" method in the graphene thin film is separated from the metal catalyst and then transferred to the substrate (FIG. 4b).

The substrate/water/graphene/PMMA, shown in FIG. 4e, of the present method can be transferred from one liquid solution into another solution without using another transfer medium (e.g., glass, polyethylene terephthalate (PET)). The well-known "floating" method for the transfer of graphene requires the help of physical transfer mediums to hold the floating graphene/PMMA and carry out the transfer.

The present invention can also further comprise a surfactant or a surface active agent, such as isopropanol (IPA), sodium dodecyl sulfate (SDS), ethanol. Incorporation of a surfactant into the cleaning solution (e.g., IPA) allows the infiltration of fluid and transfer of graphene films onto the substrate without the formation of cracks or folds during the transfer due to its self-driven transfer process. Known methods for transfer of 2-D films usually produce 2-D films having different transfer defects, such as cracks (FIG. 4c). The in-situ "face-to-face" transfer method of the present invention can preserve the high quality of the graphene thin films during transfer (FIG. 4g). As the etching and removal of the metal catalyst progresses, the graphene/PMMA contacts the substrate spontaneously with an inherent drive rendering external aid for such contact irrelevant. The spontaneous transfer process can be readily reproduced.

The etching process of the present invention occurs homogeneously throughout the substrate or wafer making this method amenable to the transfer of graphene and other 2-D film samples of any size. However, any size is possible, limited only by the size of the substrate where the graphene is grown on. For example, the size of the 2-D film can be between about 1 cm to about 20 cm (about the size of an 8 inch wafer). The success of the transfer method can be dependent on the metal coating process and the etching process. Surface smoothness does not seem to have a critical effect on the transfer results. Therefore, this transfer method can be used for the transfer of both hard and flexible substrates. Most importantly, the transfer method can be divided into detailed steps, none of which need to be conducted by hand. As such, the in-situ face-to-face transfer method can be automated. This method, can transfer any kind of material that can be grown on a metal coated-substrate, and is not limited to graphene or any particular 2-D crystalline thin film.

The substrates of the present invention are not limited to silicon, but can be dielectric substrates (for example, sapphire, quartz, glass, ceramic). This transfer process applies to all thin films grown on metal-coated substrates. The substrate can be rigid or flexible. For example, the substrate can be sapphire, glass, quartz, ceramic, boron nitride (BN), silicon (Si wafer), $Si/SiO_2$ ($Si/SiO_2$ wafer), mica, plastics, $MoS_2$, $WS_2$, $WSe_2$, black phosphorus, a polymer (including, but not limited to, polyethylene terephthalate (PET), polyimide, polymethyl methacrylate (PMMA), polypropylene (PP), and polyethylene (PE)) or a combination thereof. The transfer process can be applied to any thermal, plasma or chemical vapor deposition process that deposits a film on metal catalyst coated-substrates.

This process can be automated and is compatible with silicon wafer processing. The in-situ "face-to-face" transfer method of the present invention enables direct transfer of any 2-D crystalline film grown on metal-coated silicon wafer onto the same wafer. This supports in-line industrial scale microelectronic processing. This is the most unique aspect of the transfer process which is distinct from the roll-to-roll method. The roll-to-roll method only works for copper foil and does not work for transfer to stiff substrates like silicon wafers. Thus, the roll-to-roll process is not compatible, fundamentally, for use in silicon microelectronic processing.

The methods of the present invention can be used in any application where high quality 2-D crystalline films are required. Examples of possible applications include, but are not limited to, electronic devices and circuits, opto-electronic devices, photo-voltaic and solar cells, communication devices, displays, touch screen panels, water splitting, fuel production, single molecule sensors, high frequency transistors, optical modulators, electrochromic devices, conducting and transparent electrodes, thermal sinks, super-capacitors and batteries, scaffold for cell growth, anti-bacterial material, and impermeabilization of surfaces.

The transfer method is applicable to all types of CVD growth using metal catalyst-coated wafers, for example h-BN and other transition metal chalcogenide films. The process is relatively easy, and requires only a simple pre-treatment step, followed by immersion in etching fluid, and resembles a "transfer-free" process since there is no recovery of floating graphene needed and the grown film is not separated from the substrate it was grown on. The non-handcrafted nature of this method renders it automation compatible and industrially scalable.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of fabricating a 2-D film substrate, comprising:
    creating a subsurface gas source in a substrate;
    depositing a catalyst layer on the substrate;
    growing a crystalline thin film on the catalyst layer;
    coating a polymer layer on the crystalline thin film;
    etching the catalyst layer by liquid infiltration and simultaneously contacting the crystalline thin film with the substrate;
    cleaning the crystalline thin film and substrate to remove residual etchant used to etch the catalyst layer;
    removing moisture from the 2-dimensional crystalline film and the substrate; and
    removing the polymer layer to provide the component.

2. The method of claim 1, wherein creating of a subsurface gas source comprises pre-treatment of the substrate surface with a plasma of gases or ions.

3. The method of claim 2, wherein the plasma of gases or ions is plasma of a gas or ion selected from the group consisting of inert gases, nitrogen, oxygen, and hydrogen, or a combination thereof.

4. The method of claim 2, wherein the subsurface gas source forms a metastable phase in the substrate.

5. The method of claim 1, wherein the substrate is a dielectric or semiconductor material.

6. The method of claim 1, wherein the catalyst layer is a metal having a thickness of about 2 to about 5 times greater than the polymer layer.

7. The method of claim 6, wherein the catalyst layer has a thickness of between about 50 nm to about 1 μm.

8. The method of claim 1, wherein the crystalline thin film is a 2-D film formed from carbon, boron nitride, or 2-dimensional chalcogenides, or a combination thereof.

9. The method of claim 1, wherein the etching of the catalyst layer further comprises activating release of gas bubbles from the subsurface gas source.

10. The method of claim 9, wherein the releasing of gas bubbles from the subsurface gas source forms capillary bridges at the interface of the crystalline thin film and the substrate.

11. The method of claim 1, wherein the cleaning comprises use of a first solvent to infiltrate the interface between the crystalline thin film and the substrate.

12. The method of claim 11, wherein the solvent comprises deionized water.

13. The method of claim 1, wherein removing moisture comprises baking the 2-dimensional crystalline film and the substrate.

14. The method of claim 1, wherein the removing of the polymer comprises using a second solvent.

* * * * *